(12) United States Patent
Pomet

(10) Patent No.: US 6,424,196 B2
(45) Date of Patent: Jul. 23, 2002

(54) SECURED MASTER-SLAVE D TYPE FLIP-FLOP CIRCUIT

(75) Inventor: Alain Pomet, Rousset (FR)

(73) Assignee: STMicroelectronics S.A., Gentilly (FR)

(*) Notice: Subject to any disclaimer, the term of this patent is extended or adjusted under 35 U.S.C. 154(b) by 0 days.

(21) Appl. No.: 09/740,269

(22) Filed: Dec. 19, 2000

(30) Foreign Application Priority Data

Dec. 21, 1999 (FR) .............................. 99 16180

(51) Int. Cl.[7] .................................................. H03K 3/12

(52) U.S. Cl. ...................... 327/218; 327/203; 327/212; 326/98

(58) Field of Search ................................ 327/185, 197, 327/198–201, 202, 203, 205, 210–212, 218, 219; 714/731; 326/94–98; 377/115–117; 365/154

(56) References Cited

U.S. PATENT DOCUMENTS

| 4,873,456 A | 10/1989 | Olisar et al. ................. 327/202 |
| 5,376,848 A | * 12/1994 | Hanke et al. ................ 327/141 |

FOREIGN PATENT DOCUMENTS

| EP | 0219846 | 4/1987 |
| EP | 0624950 | 11/1994 |

* cited by examiner

*Primary Examiner*—Toan Tran
*Assistant Examiner*—Minh Nguyen
(74) *Attorney, Agent, or Firm*—Lisa K. Jorgenson; Allen, Dyer, Doppelt, Milbrath & Gilchrist, P.A.

(57) ABSTRACT

A master-slave D type flip-flop circuit includes a power consumption masking circuit including a reference stage in parallel with a master and a slave stage of the flip-flop circuit. This structure advantageously provides a switching of the flip-flop circuit on each of the leading and trailing edges of the clock signal for the sequencing of the flip-flop circuit.

23 Claims, 3 Drawing Sheets

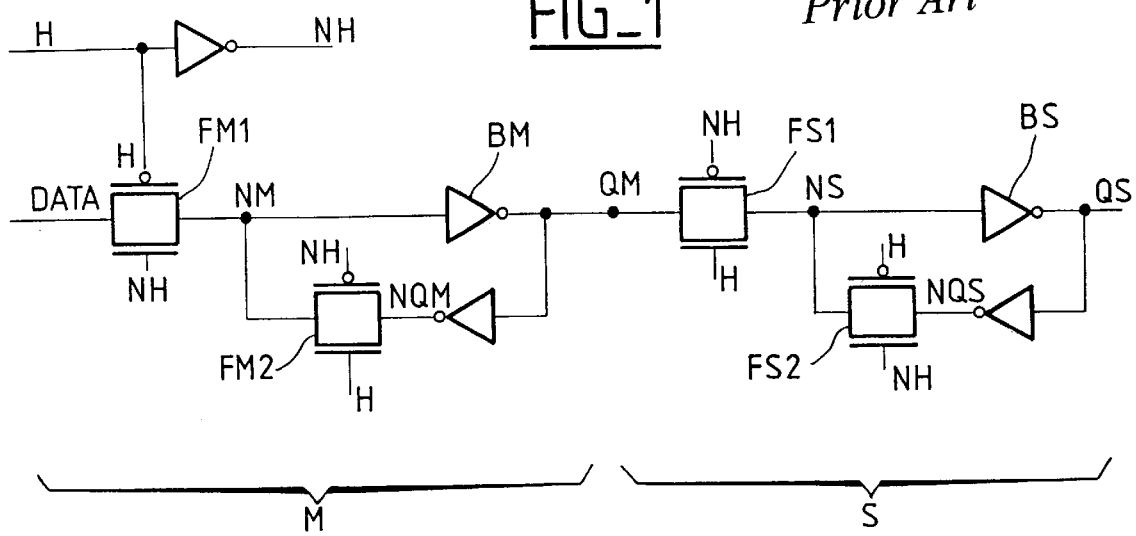
FIG_1 *Prior Art*
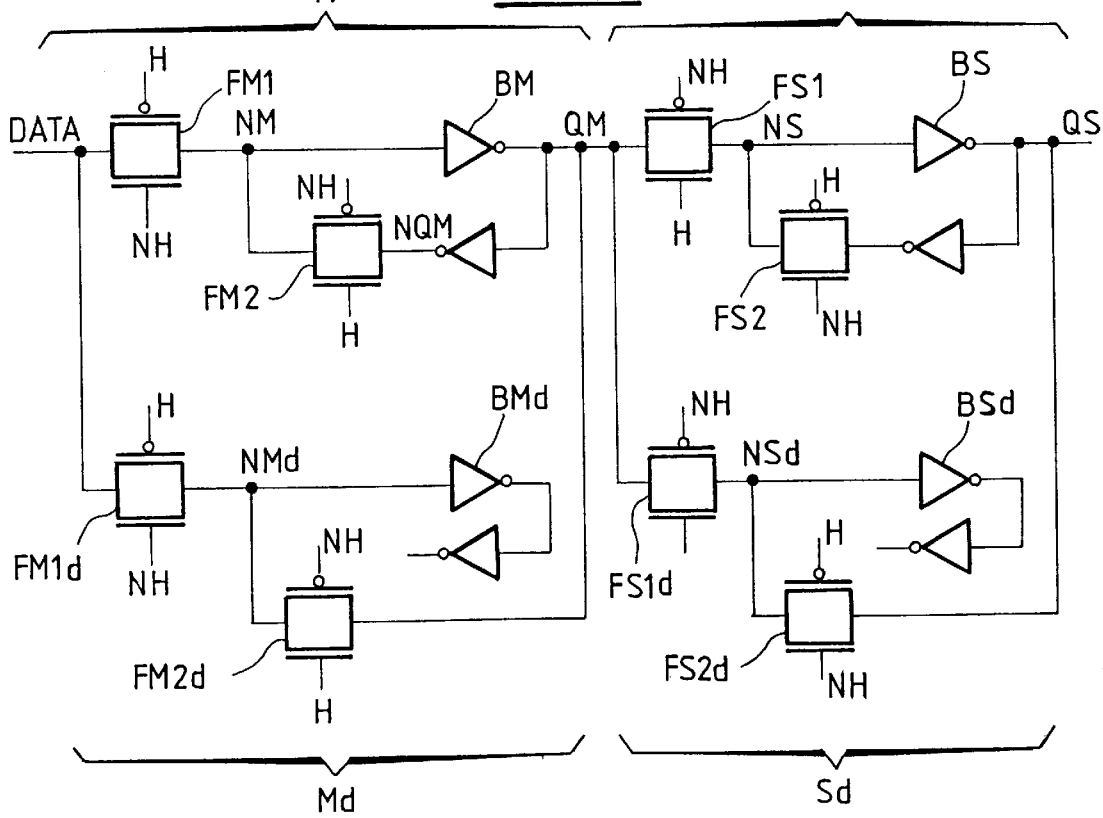
FIG_2

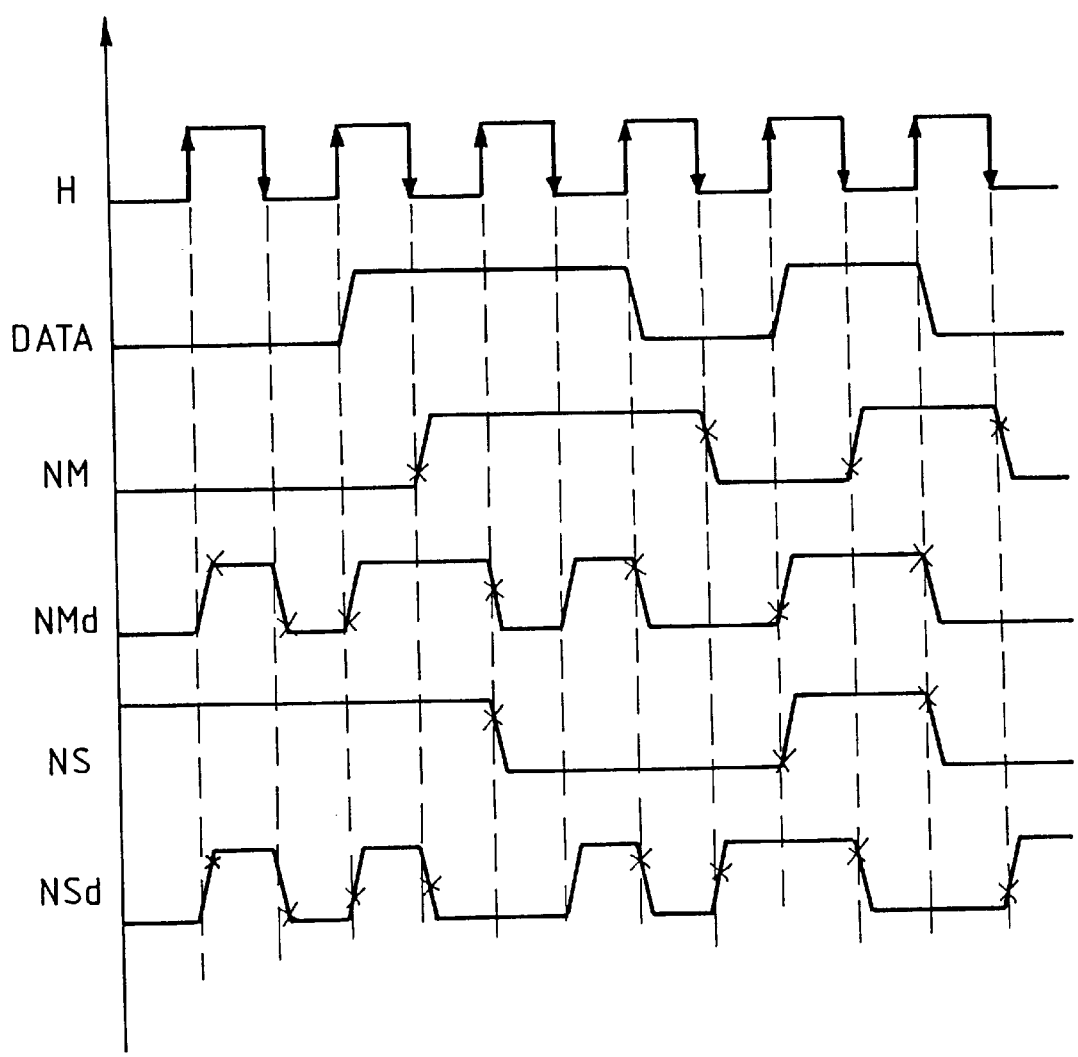

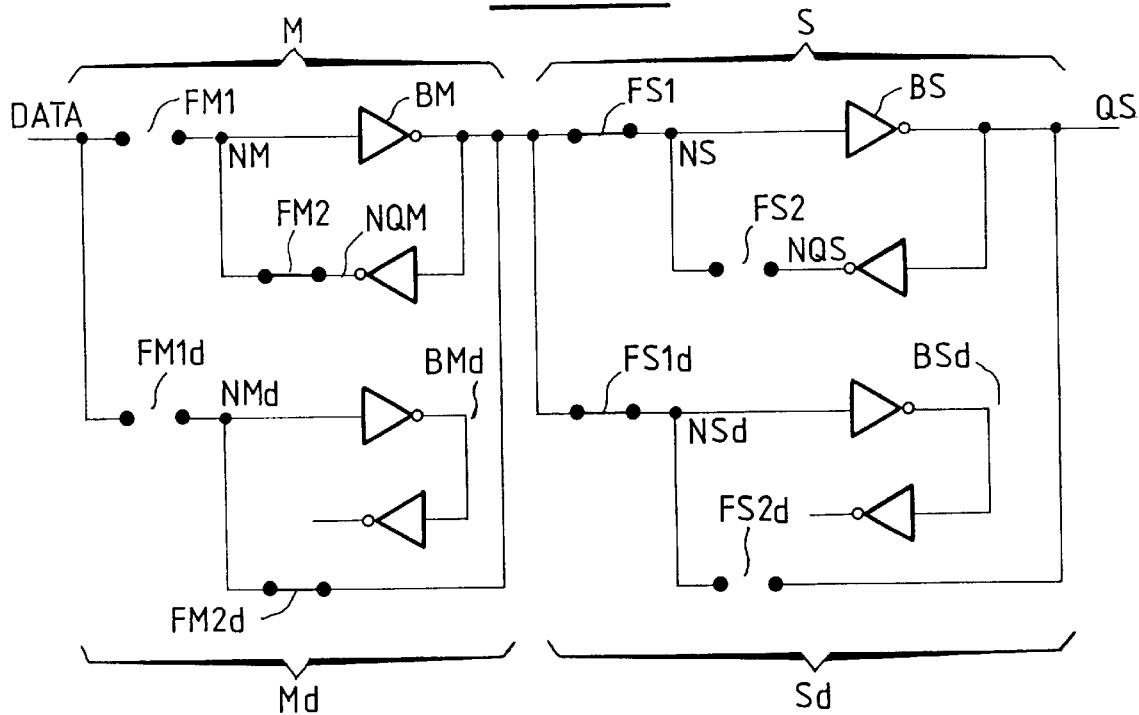
FIG_4a
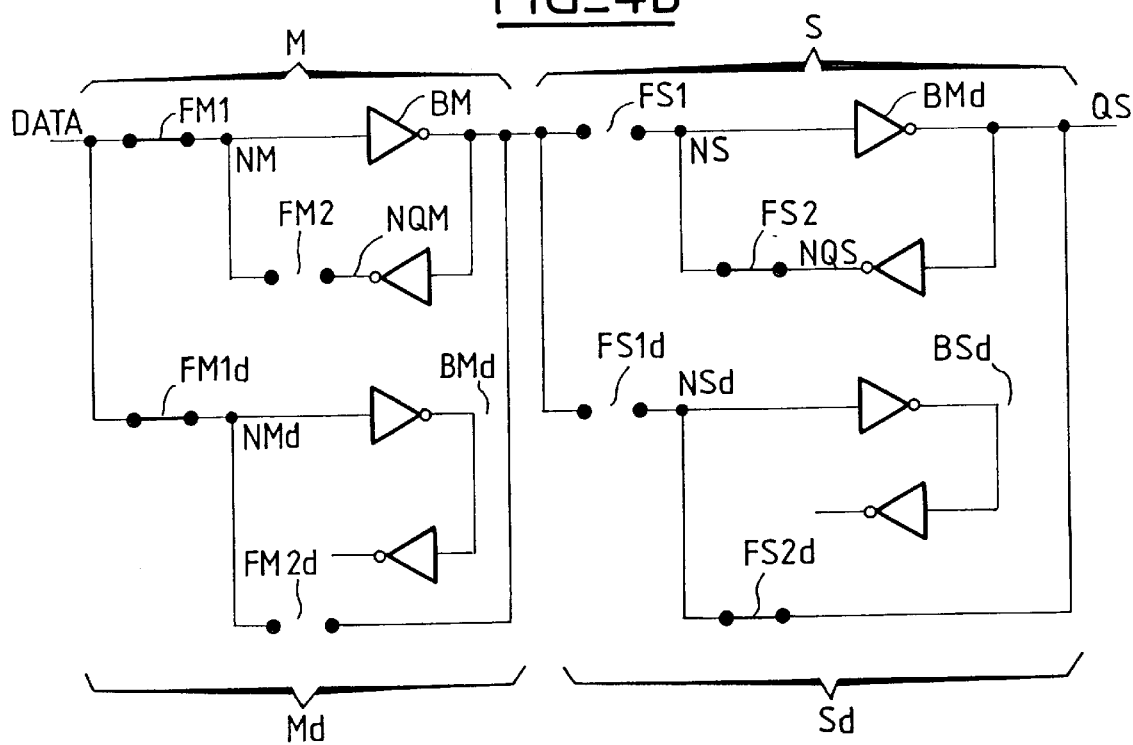
FIG_4b

SECURED MASTER-SLAVE D TYPE FLIP-FLOP CIRCUIT

FIELD OF THE INVENTION

The present invention relates to the field of electronic circuits, and, more particularly, to a master-slave D type flip-flop circuit with a secured structure. The present invention may be used in applications in which access to services or data is strictly monitored, and in which electronic circuits implementing security hardware and/or software are used. Electronic circuits of this kind are used especially in chip cards or microelectronic circuits for certain applications such as accessing certain data banks, banking applications, and the like. For these applications, such electronic circuits have an architecture formed around a microprocessor and memories. These circuits may be used, for example, to process secret or confidential data, to encipher messages with cryptography algorithms, to decipher received messages, or to compute signatures.

BACKGROUND OF THE INVENTION

It has been observed that external attacks on a circuit may be carried out based upon the differential analysis of current consumption of the circuit during the performance of certain instructions. In particular, it is possible to determine all or part of a secret key used in a cryptography algorithm performed by a microprocessor. These external attacks, known as differential power analysis or DPA attacks, are based on the fact that the current consumption of the microprocessor carrying out instructions varies according to the data being handled. For example, when an instruction performed by the microprocessor requires bit-by-bit handling, there are two different power consumption profiles at the instant of execution, depending on whether the bit being handled is equal to 1 or 0.

Thus, the DPA attack makes use of the difference in the current consumption profile in the electronic circuit during the performance of an instruction depending on the value of the bit or bits handled. Stated alternatively, this attack uses a statistical approach to verify assumptions concerning the value of the bits of a confidential data element. This is done by making the same scenario run several times in the electronic circuit, with different input values of this scenario, and by analyzing all the consumption profiles obtained.

The present invention is designed to make it more difficult to carry out DPA attacks of this kind on certain instructions. More specifically, the present invention makes it impossible in the first order approach to differentiate between the handling of a 1 and the handling of a 0 by these instructions through the differential analysis of the consumption profiles.

All the data elements handled in an electronic circuit travel in transit, between memories and the microprocessor, through registers. Other registers are used by the microprocessor to store data during the execution of certain programs. More particularly, some of these registers are required to transmit sensitive data, such as a secret key of a cryptography algorithm.

These registers are usually based on master-slave type flip-flop circuits. In this type of flip-flop circuit, if a new data element corresponding to a data element already stored in this flip-flop circuit is presented at the input, there is no switching in the flip-flop circuit. The switching in the flip-flop circuit gives rise to a specified current consumption. Thus, depending on whether the data changes or does not change in the flip-flop circuit, there are two distinct consumption profiles (or signatures), and this fact may render a DPA attack possible while these registers are being used.

SUMMARY OF THE INVENTION

It is an object of the invention to provide a secure master-slave D type flip-flop circuit so that a current consumption profile of the flip-flop circuit is independent of the data handled therein.

The basic idea of the invention is that the flip-flop circuit will always provide a switching operation, whatever the state at the time, of the flip-flop circuit and the state of the new data element presented at the input.

The invention therefore relates to a master-slave D type flip-flop circuit including a master stage followed by a slave stage. The two stages may have an identical structure including a first pass gate for the transmission on an internal node of an input data element and a storage loop with inverters connected to the internal node to supply a data element at an output of the stage. The storage loop may also include a second pass gate for the transmission on the internal node of the data element complementary to the output data element.

The flip-flop circuit may also include a power consumption masking circuit including, at each of the stages (i.e., the master and slave stage), a parallel reference stage with a similar structure whose storage loop is disconnected from the output of the associated master or slave stage. The second pass gate of the storage loop of the reference stage may be connected between the output of the associated master stage or slave stage and the internal node of the reference stage.

The invention also relates to an integrated circuit including at least one secured flip-flop circuit as described above. Such integrated circuit is especially suited for registers that are required to process confidential or secret data elements.

BRIEF DESCRIPTION OF THE DRAWINGS

Other features and advantages of the invention will be described in detail in the following description of different embodiments, given by way of a non-limitative example, with reference to the appended figures, in which:

FIG. 1 is a schematic diagram of a master-slave D type flip-flop circuit according to the prior art;

FIG. 2 is a schematic diagram of a master-slave D type flip-flop circuit according to the present invention;

FIG. 3 is a timing diagram showing the changes undergone at the different internal nodes in the flip-flop circuit of FIG. 2 as a function of the input data elements; and FIGS. 4a and 4b are schematic diagrams illustrating the equivalent diagram of a master-slave flip-flop circuit according to the invention at a high level and a low level, respectively, of the clock signal H for the sequencing of the flip-flop circuit.

DETAILED DESCRIPTION OF THE PREFERRED EMBODIMENTS

A typical structure of a master-slave D type flip-flop circuit is shown in FIG. 1. It has a master stage M followed by a slave stage S. These two stages have identical structures corresponding to a D type flip-flop circuit, and they are controlled in phase opposition.

Referring to the master stage M, this structure has a first pass gate FM1 and a second pass gate FM2, each connected at their outputs to the same input internal node NM of a storage loop BM by inverters. These two pass gates FM1, FM2 are controlled in phase opposition by a clock signal H for the sequencing of the flip-flop circuit. The first pass gate FM1 is used for the transmission on the node NM of the data element DATA applied to the input of the stage in one phase. The second pass gate FM2 enables the imposition on the node NM of the complementary data element NQM of the output QM of the stage in the other phase.

Each pass gate typically has two transistors of opposite types. As seen in FIG. 1, these may be a P type MOS transistor and an N type MOS transistor. The transistors of a pass gate are controlled from the clock signal H for the sequencing of the flip-flop circuit so that they are on at the same time and off at the same time.

The first pass gate FM1 is equivalent to an open circuit on the high level of the clock signal H and equivalent to a short circuit on the low level of the clock signal. The second pass gate FM2 is equivalent to a short circuit on the high level of the clock signal H and equivalent to an open circuit on the low level of the clock signal. The storage loop BM has a first inverter connected between the internal node NM and the output QM of the stage and a second inverter connected between the output QM and the second pass gate FM2. Thus, at the output of the second inverter, there is a complementary output NQM applied to the input of the second pass gate FM2.

The slave stage has an identical structure. As such, the references corresponding to the references FM1, FM2, NM, BM, QM and NQM in the master stage are the references FS1, FS2, NS, BS, QS and NQS in the slave stage. The pass gates of the slave stage are controlled in phase opposition with respect to the pass gates of the master stage. Thus, the first pass gate FM1 of the master stage and the second pass gate FS2 of the slave stage are on (i.e., equivalent to short circuits) at the low level of the clock signal H and off (i.e., equivalent to open circuits) at the high level of the clock signal H. The second pass gate FM2 of the master stage and the first pass gate FS1 of the slave stage are on (i.e., equivalent to short circuits) on the high level and off (i.e., equivalent to open circuits) on the low level of the clock signal H.

With such a master-slave D flip-flop circuit according to the prior art, if a new data element identical to the previous data element comes to the input of the master stage, no switching operation will take place either in the master stage or in the slave stage. Indeed, if the node NM is already at the level of the new data element at the input, there will be no change in either of the two storage loops, master and slave, and therefore no switching in the master-slave D type flip-flop circuit. However, if a data element of a different level is applied to the input of the master-slave flip-flop circuit, at the first trailing edge that follows there will be a switching operation in the storage loop of the master stage. Then, at the next leading edge, there will be a switching operation in the storage loop of the slave stage.

Thus, with a master-slave D type flip-flop circuit according to the prior art, it is possible at a given time, depending on the data element handled at the input, to have either no switching operation in the flip-flop circuit or a switching operation in the storage loop of either of the master or the slave stage. This characteristic of operation of the master-slave D flip-flop circuit enables a differential analysis on the current signature of a circuit when it uses registers based on such flip-flop circuits. This is because, depending on the data handled, the current consumption profile of the circuit is different.

Turning now to FIG. 2, a master-slave D type flip-flop circuit according to the present invention is illustrated. This flip-flop circuit may be used to obtain the same consumption profile in all cases in forcing the selection switching in the flip-flop circuit at each high level and low level of the clock. This may be done independently of the flow of input data.

This flip-flop circuit has two stages, namely a master stage M and a slave stage S as above, with identical structures. To simplify the description, the same reference labels will be used in FIG. 2 for the elements common to FIG. 1. According to the invention, a consumption masking circuit is included in the flip-flop circuit. This masking circuit includes, in parallel on each of the master and slave stages, a reference or "dummy" stage with a similar structure whose storage loop is disconnected from the output of the associated master or slave stage. The second pass gate of this storage loop of the reference stage is connected between the output of the associated master or slave stage and the internal node of the reference stage.

For the storage loop of the reference stage, the same chain of inverters may be used as that of the storage loops of the master and slave stages. Also, the equivalent load of this chain of inverters may be obtained, as seen from the internal node of the main stage, to obtain behavior (in terms of consumption) that is identical to that of the storage loop of the main stage with which the reference stage is associated. The two inverters of the loop may then be replaced by an equivalent capacitor connected between the internal node and ground. This is sufficient for a first-order approach. Another capacitor (not shown) may be included between the supply voltage and the internal node for a more efficient approximation of the behavior of the two inverters in selection switching.

As seen in FIG. 2, the reference stage Md of the master stage also includes a first pass gate FM1d to transmit the input data element DATA on the internal node Nmd. A storage loop BMd includes two series-connected inverters with the same characteristics as those of the storage loop of the master stage. Also included is a second pass gate FM2d for the transmission of the output QM of the master stage to the internal node NMd of the reference stage.

The reference stage Sd of the slave stage S similarly includes a first pass-gate FS1d for the transmission of the state of the output QM of the master stage to an internal node NSd, a storage loop BSd including two series-connected inverters with the same characteristics as those of the storage loop of the master stage, and a second pass gate FS2d to transmit the output QS of the slave stage to the internal node NSd of the reference stage. The pass gates of each reference stage are controlled in the same way as the corresponding pass gates in the associated main stage.

By including a reference stage of this kind on each of the master and slave stages of the flip-flop circuit, a systematic switching operation is enforced in the flip-flop circuit on each clock edge, whatever the data present at input This forced switching operation in the flip-flop circuit includes in practice switching two of the four storage loops of the stage on each edge. This causes the switching of each of the inverters of these two loops. Thus, on each of the leading and trailing edges of the clock signal for sequencing the flip-flop circuit, the same current consumption profile is obtained (as a first-order result) independently of the input data element.

The foregoing will be further illustrated with reference to FIG. 3. The timing diagram of FIG. 3 represents the different states of the internal input nodes of the four storage loops of a flip-flop circuit according to the invention for a flow of data elements DATA presented at the input of the secured master-slave D type flip-flop circuit. Also, for ease of understanding, FIGS. 4a and 4b show the structure of the flip-flop circuit according to the present invention with the equivalent diagram of the pass gates at the high level and the low level, respectively, of the clock signal H.

A leading edge of the clock signal H makes the flip-flop circuit go into a next stage, shown in FIG. 4a. That is, the gates FM1, FM1d, FS2, FS2d are on, and the gates FM2, FM2d, FS1, FS1d are off. A leading edge of the clock signal H makes the flip-flop circuit go into a next state, shown in FIG. 4b. That is, the gates FM1, FM1d, FS2, FS2d are off, and the gates FM2, FM2d, FS1, FS1d are on.

In the exemplary operating sequence shown in FIG. 3, the starting conditions as are follows: the clock signal H is at a low level or 0; the internal node NM of the master stage is at 0; the internal node NMd of the associated reference stage is at 0; the internal node NS of the slave stage is at 1; and the internal node NSd of the associated reference stage is at 0. On the first leading edge of the clock signal H, (FIG. 4a) the node NM cut off from the input DATA remains unchanged, i.e., at 0. There is therefore no switching operation in the storage loop of the master stage. The output QM of the master stage is at 1. Since the internal node NS of the slave stage is already at 1, there is no change at the input of the storage loop of the slave stage, and therefore no switching in this loop.

However, the gate FM2d of the reference stage associated with the master stage makes the internal node NMd go from 0 to 1, leading to a switching in the associated storage loop. The gate FS1d of the reference stage of the slave stage makes the associated internal node NSd go from 0 to 1. This gives rise to a switching in the associated storage loop. Thus, on this first leading edge, there is a switching operation in each of the reference stages of the flip-flop circuit.

On the next trailing edge (FIG. 4b), DATA is still at 0. The internal node NM of the master stage remains at 0. There is therefore no switching in the storage loop of the master stage. However, the gate FM1d makes the internal node NMd go from 1 to 0, leading to a switching operation in the associated storage loop. The internal node NS of the slave stage remains unchanged, i.e., at 1. The gate FS2d of the slave stage makes the internal node NSd of the slave reference stage go from 1 to 0, leading to a switching operation in the storage loop of this reference stage. Thus, on this trailing edge, there is a selection switching operation in each of the references stages of the flip-flop circuit.

On the next leading edge, the data element DATA has gone to 1. The node NM cut off from the input DATA remains unchanged, i.e., at 0. There is therefore no switching in the storage loop of the master stage. The output QM of the master stage is at 1. The gate FM1d therefore makes the internal node NMd go from 0 to 1, leading to a switching operation in the storage loop of the associated reference stage. The internal node NS of the slave stage remains unchanged, since it is already at 1. There is therefore no switching in the storage loop of the reference stage. The gate FS1d of the slave reference stage makes the internal node NSd of the slave reference stage go from 0 to 1, leading to a switching operation in the associated storage loop. Thus, on this leading edge, there is a switching operation in each of the reference stages of the flip-flop circuit.

On the next trailing edge, DATA is still at 1. The internal node NM of the master stage goes from 0 to 1, thus leading to a switching operation in the storage loop of the master stage. The internal node NMd remains at 1. There is therefore no switching in the storage loop of the reference stage associated with the master stage. The internal node NS of the slave stage remains unchanged, i.e., at 1.

The gate FS2d of the slave stage makes the internal node NSd of the associated reference stage go from 1 to 0, leading to a switching operation in the storage loop of this reference stage. Thus, on this trailing edge, there is a switching operation in the master stage and in the reference stage associated with the slave stage.

It can thus be shown that, whatever the conditions in the flip-flop circuit and whatever the flow of data at the input, there will always be a switching of two of the loops of the secured D type master-slave flip-flop circuit according to the invention. In FIG. 3 crosses are used to indicate the switching operations carried out at each edge of the clock signal. The switching of a loop must, of course, be understood to mean the switching of each of the inverters of the loop. In the reference stages, if the storage loop is made by an equivalent capacitor, this results in the switching of this capacitor, or more precisely in its charging or its discharging.

The use of a secured master-slave D type flip-flop circuit of this kind for each cell of the registers required to process confidential data elements in an electronic circuit thus prevents DPA attacks from being made during the time in which these registers are used. It will be noted that, in practice, when these registers are used, they are not the site of any switching (the clock signal is not transmitted).

A secured master-slave D type flip-flop circuit according to the invention may be used in numerous applications in which it is desired to prevent differential analysis of the current consumption. Of course, the invention is not limited to the structure of the flip-flop circuit described above. In particular, the term "inverter" must be taken in its wider functional sense, independently of its constitution.

That which is claimed is:

1. A master-slave D type flip-flop circuit comprising:
   a master stage;
   a slave stage connected to said master stage and having a substantially identical structure thereto, said slave stage comprising
   an internal node,
   a first pass gate for providing an input data element on the internal node, and
   a storage loop comprising at least one inverter connected to the internal node and supplying output data at an output, and a second pass gate for providing data complementary to the output-data on the internal node; and
   a power consumption masking circuit comprising a respective reference stage in parallel with each of said master and slave stages and having a substantially identical structure except that the at least one inverter of each reference stage is disconnected from the output of its respective master stage or slave stage and that the second pass gate of the storage loop of each reference stage is connected between the output of its respective master stage or slave stage and the internal node of said reference stage.

2. The master-slave D type flip-flop circuit according to claim 1 wherein the storage loop in each of said reference stages provides a load that is equivalent to that of said at least one inverter of said storage loop of its respective master stage or slave stage with respect to the internal node of its respective master stage or slave stage.

3. The flip-flop circuit according to claim 1 wherein said slave stage follows said master stage.

4. A flip-flop circuit comprising:
   a master stage;

a slave stage connected to said master stage and having a substantially identical structure thereto, said slave stage comprising
an internal node,
a first pass gate for providing an input data element on the internal node, and
a storage loop connected to the internal node, said storage loop supplying output data at an output of said slave stage and providing data complementary to the output data on the internal node; and
a power consumption masking circuit connected to said master and slave stages for causing substantially the same amount of current to be consumed by the flip-flop circuit at each clock transition independent of input data flow.

5. The flip-flop circuit according to claim 4 wherein said storage loop comprises at least one inverter connected to the internal node for supplying output data at the output, and a second pass gate for providing the data complementary to the output data on the internal node.

6. The flip-flop circuit according to claim 1 wherein said power consumption masking circuit comprises a respective reference stage in parallel with each of said master and slave stages and having a substantially identical structure except that the at least one inverter of each reference stage is disconnected from the output of its respective master stage or slave stage and that the second pass gate of said storage loop of each reference stage is connected between the output of its respective master stage or slave stage and the internal node of said reference stage.

7. The flip-flop circuit according to claim 1 wherein said storage loop in each of the reference stages provides a load that is equivalent to that of said at least one inverter of said storage loop of its respective master stage or slave stage with respect to the internal node of its respective master stage or slave stage.

8. The flip-flop circuit according to claim 4 wherein said slave stage follows said master stage.

9. An integrated circuit comprising:
a plurality of master-slave D type flip-flop circuits each comprising
a master stage;
a slave stage connected to said master stage and having a substantially identical structure thereto, said slave stage comprising
an internal node,
a first pass gate for providing an input data element on the internal node, and
a storage loop comprising at least one inverter connected to the internal node and supplying output data at an output, and a second pass gate for providing data complementary to the output data on the internal node; and
a power consumption masking circuit comprising a respective reference stage in parallel with each of said master and slave stages and having a substantially identical structure except that the at least one inverter of each reference stage is disconnected from the output of its respective master stage or slave stage and that said second pass gate of the storage loop of each reference stage is connected between the output of its respective master stage or slave stage and the internal node of said reference stage.

10. The integrated circuit according to claim 1 wherein each of said slave stages follows its respective master stage.

11. The integrated circuit according to claim 9 wherein the storage loop in each of said reference stages provides a load that is equivalent to that of said at least one inverter of said storage loop of its respective master stage or slave stage with respect to the internal node of its respective master stage or slave stage.

12. The integrated circuit according to claim 9 wherein said plurality of flip-flop circuits form registers for processing confidential data.

13. An integrated circuit comprising:
a plurality of flip-flop circuits each comprising
a master stage;
a slave stage connected to said master stage and having a substantially identical structure thereto, said slave stage comprising
an internal node,
a first pass gate for providing an input data element on the internal node, and
a storage loop connected to the internal node, said storage loop supplying output data at an output of said slave stage and providing data complementary to the output data on the internal node; and
a power consumption masking circuit connected to said master and slave stages for causing substantially the same amount of current to be consumed by said flip-flop circuit at each clock transition independent of input data flow.

14. The flip-flop circuit according to claim 13 wherein each of said storage loops comprises at least one inverter connected to the internal node for supplying output data at the output, and a second pass gate for providing the data complementary to the output data on the internal node.

15. The flip-flop circuit according to claim 14 wherein each of said power consumption masking circuits comprises a respective reference stage in parallel with each of said master and slave stages and has a substantially identical structure except that the at least one inverter of each reference stage is disconnected from the output of its respective master stage or slave stage and that the second pass gate of said storage loop of each reference stage is connected between the output of its respective master stage or slave stage and the internal node of said reference stage.

16. The flip-flop circuit according to claim 15 wherein said storage loop in each of the reference stages provides a load that is equivalent to that of said at least one inverter of said storage loop of its respective master stage or slave stage with respect to the internal node of its respective master stage or slave stage.

17. The integrated circuit according to claim 13 wherein said plurality of flip-flop circuits comprise master-slave D-type flip-flop circuits.

18. The integrated circuit according to claim 13 wherein each of said slave stages follows its respective master stage.

19. The integrated circuit according to claim 13 wherein said plurality of flip-flop circuits form registers for processing confidential data.

20. A method for masking power consumption of a flip-flop circuit comprising a master stage and a slave stage connected to said master stage and having a substantially identical structure thereto, the method comprising:
providing input data on respective internal nodes of said master and slave stages;
supplying output data at respective outputs of said master and slave stages;
providing data complementary to the output data on the internal nodes; and
switching the master and slave stages to cause substantially the same amount of current to be consumed by the flip-flop circuit at each clock transition independent of input data flow.

21. The method according to claim 1 wherein the master and slave stages each comprises a storage loop comprising at least one inverter connected to the internal node for supplying the output data at the output and a second pass gate for providing the data complementary to the output data on the internal node.

22. The method according to claim 21 wherein said flip-flop circuit comprises a power consumption masking circuit for causing the switching, said power consumption masking circuit comprising a respective reference stage in parallel with each of the master and slave stages and having a substantially identical structure except that the at least one inverter of each reference stage is disconnected from the output of its respective master stage or slave stage and that the second pass gate of the storage loop of each reference stage is connected between the output of its respective master stage or slave stage and the internal node of said reference stage.

23. The method according to claim 22 wherein the storage loop in each of the reference stages provides a load that is equivalent to that of the at least one inverter of the storage loop of its respective master stage or slave stage with respect to the internal node of its respective master stage or slave stage.

* * * * *